United States Patent [19]

Fuhr

[11] 4,262,080

[45] Apr. 14, 1981

[54] METHOD FOR APPLYING PHOTOGRAPHIC RESIST TO OTHERWISE INCOMPATIBLE SUBSTRATES

[76] Inventor: Robert A. Frosch, Administrator of the National Aeronautics and Space Administration, with respect to an invention of Wolfgang Fuhr, North Haldon, N.J.

[21] Appl. No.: 956,168

[22] Filed: Oct. 31, 1978

[51] Int. Cl.$^3$ .................................................. G03C 5/00
[52] U.S. Cl. ..................................... 430/271; 430/325; 430/329; 430/330
[58] Field of Search ........................... 96/67, 36, 36.2; 430/271, 325, 329, 330

[56] References Cited

U.S. PATENT DOCUMENTS

| | | | |
|---|---|---|---|
| 2,726,200 | 12/1955 | Holsapple | 96/36 |
| 3,545,973 | 12/1970 | Goersma et al. | 96/36 |
| 3,547,629 | 12/1970 | Kinney et al. | 96/36.2 |
| 3,808,001 | 4/1974 | Konstantouros et al. | 96/36 |

*Primary Examiner*—Won H. Louie, Jr.

*Attorney, Agent, or Firm*—Edward K. Fein; John R. Manning; Marvin F. Matthews

[57] ABSTRACT

A new and improved method for applying photographic resists to otherwise incompatible substrates, such as, for example, a baking enamel paint surface, is described wherein the uncured enamel paint surface is coated with a non-curing lacquer which is, in turn, coated with a partially cured lacquer. The non-curing lacquer adheres to the enamel and a photo resist material will satisfactorily adhere to the partially cured lacquer. Once normal photo etching techniques are employed the lacquer coats can be easily removed from the enamel leaving the photo etched image. This invention is particularly applicable to preparation of edge-lighted instrument panels. In such case a coat of uncured enamel is placed over the cured enamel followed by the lacquer coats and the photo resists which is exposed and developed in the normal way. Once the uncured enamel, now having had the image etched upon it, is cured, the lacquer coats are removed leaving an etched panel.

3 Claims, No Drawings

METHOD FOR APPLYING PHOTOGRAPHIC RESIST TO OTHERWISE INCOMPATIBLE SUBSTRATES

ORIGIN OF THE INVENTION

The invention described herein was made in the performance of work under a NASA contract and is subject to the provisions of section 305 of the National Aeronautics and Space Act of 1958, public law 85-568 (72 stat. 345; 45 U.S.C. 2457).

BACKGROUND OF THE INVENTION

1. Field of the Invention

The present invention relates to a method for applying photo resists to an otherwise incompatible substrate.

2. Description of the Prior Art

The technique of applying images to substrates through the use of a photo resists has long been known and many uses therefor currently exist, particularly in preparing printed circuits in a manner described in U.S. Pat. No. 3,547,629, for example, or in making highly sophisticated scientific apparatus such as described in U.S. Pat. No. 3,808,001, for example. These resists are also used in the preparation of various articles where an image is desired such as, for example, edge-lighted panels such as are used as aircraft instrument panels.

In certain applications, such as, for example, space craft where there is a concern about flamability and outgassing it is necessary to use baked enamel paints for such panels. However, etching such panels to display images containing needed information has been found to be difficult since the photo resist material will not adhere adequately to the baking enamel substrate to allow a proper image to be formed. While photo sensitive resist materials will adhere to a partially cured lacquer surface the lacquer will discolor when an uncured enamel is cured at elevated temperatures. I have now discovered a method for applying photo resist materials to substrates which are normally incompatible with the photo resist material, particularly substrates painted with a baking enamel substrate.

SUMMARY OF THE INVENTION

Photo sensitive resist materials can be applied to incompatible substrates to be etched after development of the photo resist, particularly enameled surfaces, by applying to such substrate a coat of a non-curing lacquer followed by a coat of lacquer which is partially cured. The photo resist material is applied to the partially cured lacquer coat. What follows is the normal technique for exposing and developing the photo resist and etching to impart an image to the substrate.

In the instance of enameled instrument panels the panel part painted with a cured enamel, usually white, is painted with an enamel paint of contrasting color, usually black or gray, which is not cured by baking. Upon this uncured enamel substrate to be etched is applied a coat of a non-curing lacquer followed by a coat of partially cured lacquer. A photo resist, either positive or negative, is applied and exposed through an appropriate mask, depending upon the nature of the photo resist. After exposure, the photo resist is developed and the lacquer and uncured enamel removed to provide the proper image bearing desired information on the panel. The enamel is then cured, fixing the image wherein the light colored enamel shows through the dark colored, contrasting, enamel. The balance of the photo resist and lacquer coats are removed to leave a beautifully etched instrument panel.

DESCRIPTION OF THE PREFERRED EMBODIMENTS

The method of imparting an image to a substrate using photo resist techniques is well known and many such materials are available in the marketplace with instructions from the manufacturers for their use.

Briefly, however, the photo resist material, in the absence of ultraviolet light, is applied to a substrate to which it adheres. A mask, either positive or negative, depending upon the nature of the photo resist material being used, is placed over the photo resist material in the position at which the image is desired to be etched in the substrate. The photo resist is then exposed through the mask to a source of ultraviolet light which energizes a reaction in the photo resist rendering a part of it soluble, the rest being insoluble, to selected solvents.

If the resist is a negative resist the material exposed to the ultraviolet light is rendered insoluble by the exposure. As is well known, the amount of exposure necessary is made followed by the development of the exposed resist by removing soluble materials. There is left then an image which can be imparted by treating, etching, the substrate. In the case of metallic substrates the image is generally imparted by acid etching to remove metal exposed by developing the resist. The image-producing step in the practice of this invention will be hereinafter described. Once the image is produced in the substrate the remaining resist is removed and the usual steps taken to restore the substrate to a useable condition with the image imparted thereon. These steps vary, of course, with respect to the substrates used and the images desired.

It is the practice of this invention to provide a method whereby the photo resist material can be used with substrates with which the resist is normally incompatible. It is known that most photo resist materials will adhere to cured, or partially cured, lacquers but other substrates present somewhat of a problem. Accordingly, in the practice of this invention such as incompatible substrate is first coated with a lacquer which is uncurable in any of the subsequent steps of treatment followed by applying a second coat of a lacquer which is dried, in air or otherwise, to remove a portion of the solvent to make the lacquer compatible with the photo resist material. As the term is used herein, the lacquer is "partially cured" but not cured to the point of becoming resistant to being removed by a solvent, i.e. acetone. Such lacquers are well known to those of ordinary skill in the art and generally, given the conditions under which the invention is to be practiced, simple selection only is necessary for carrying out these steps of the invention. It is preferred, however, to use a clear lacquer for both the first and second lacquer coats.

Once this outer layer of lacquer is partially cured it is coated with the desired photo resist material. As has previously been stated many such materials are available and well known to those skilled in the art. Preferred photo resist materials are those negative resists wherein the unexposed portions remain water soluble such that development can be accomplished by use of a water spray. It has been found that the photo resist material adheres very well to the partially cured lacquer coating and, once the exposed photo resist is developed, the lacquer coats are easily removed by a spray of acetone or some other appropriate solvent for the lacquer. Once these coats are removed the substrate previously incompatible with photo resist materials can now be etched to form an image. The other steps which follow, i.e. removal of the resist, any treatment of the substrate, and removal of the lacquer is well within the ordinary skill in the art.

As a specific application of my invention, its use in connection with preparing an instrument panel having information etched therein using photo resist techniques on a baking enamel substrate will be considered. Since it is desired in this particular application to have the images etched into the panel to appear as white on a dark background, i.e. black or gray, a panel coated with a white baked enamel paint surface is chosen as the substrate. On the surface of such enamel is applied, preferably by spraying, a dark enamel paint coat which remains uncured. Some drying of course could be allowed to remove excess solvent. To this uncured enamel coat is applied a first lacquer coat which is non-curing at the conditions of baking the enamel for curing which occurs later in the practice of my invention. To this non-curing lacquer coat is applied a second lacquer coat which is partially cured. Such curing must not be so great that the lacquer cannot be dissolved with acetone. Clear lacquers are preferably used in the practice of my invention but it should be known that the use of clear lacquers is not absolutely necessary.

Once the second lacquer coat is partially cured a photo resist material is applied to the second lacquer coat; in the absence of ultraviolet light, of course. Any suitable photo resist known to those of ordinary skill in the art can be used. However, in the practice of this embodiment of my invention it is preferred to use a negative photo resist wherein a polyvinyl polymer is formed upon exposure to UV light since unexposed material, in the form of the desired image, is generally water soluble and conveniently removed through use of a water spray. Preferably the lacquer coats and photo resists are all applied by spraying.

The photo resist is exposed to ultraviolet light through a mask containing the images desired to be imparted on the edge lighted panel. While either positive or negative images can be used the preferred embodiment of this invention involves employing a positive image on top of the resist such that the exposed portion of the resist is cross-linked becoming generally insoluble when compared with the unexposed photo resist. Thus the image is transferred to the photo resist material which is then developed. In this case, water is used to develop the image, removing the unexposed resist. This is accomplised by merely spraying wash water on the panel. Other photo resist materials would require washing with a suitable solvent to develop the resist.

This then exposes the lacquer coat which is sprayed with acetone and dissolved as is the uncured enamel paint coating beneath the lacquer and results in exposing the desired image in white through the dark uncured enamel coating. The substrate having now been etched to form the desired images; the resist exposed to the UV light, and generally insoluable as compared with the unexposed resist, is removed in the practice of this embodiment by spraying with a mixture of four parts water to one part 35% hydrogen peroxide at a temperature of about 100° F. (38° C.), plus or minus 20° F. (7° C.).

Once all remaining resist is removed the part is then baked to cure the outer coat of enamel on the panel making it solvent resistant. Once the enamel is cured by baking at known temperatures for a sufficient period of time to cure same, the lacquer coats are stripped from the panel using an acetone spray at ambient temperatures followed by a water rinse. The remaining part, i.e. the panel, thus has been photo etched to provide a display of information in white against a dark background which is suitable for illumination from the edges of the panel. Of course, the same part can be again subjected to the steps of the invention to provide yet another layer of etched enamel, if desired to give a deeper image. Prior to this invention such was not possible since the photo resist material would not adhere to the enamel substrate to be etched.

While most of the steps in the practice of the method of this invention are known it was heretofore unknown how to achieve satisfactory adherence of the photo resist to uncured enamel to properly protect the enamel from attack and thinning from the solvents used to develop the resist. I have solved that problem by using the two intermediate lacquer coats as described above.

As can be seen from the foregoing discussion of my invention many uses can be made thereof. From such discussions those skilled in the art will be able to make many applications, variations and modifications thereof without departing from the spirit and scope of the appended claims.

I claim:

1. A method for applying a photo resist material to an uncured enamel paint-coated, baked enamel substrate with which the photo resist material is normally incompatible, comprising the steps of:
    applying a first lacquer coating to the substrate, which first lacquer coating is uncurable at subsequent processing conditions of baking the uncured enamel paint-coated baked enamel substrate for curing;
    applying a second partially cured lacquer coating over the first lacquer coating; and
    applying to the partially cured second lacquer coat a water soluble photo resist material suitable for receiving an image by exposure to ultraviolet light through an appropriate mask which water soluble photo resist material normally will not adhere to an uncured enamel paint.

2. A method for creating an image on an uncured enamel-paint coated, baked enamel substrate which comprises the steps of:
    applying an uncured enamel paint coat to the baked enamel substrate;
    applying a first lacquer coat to the uncured enamel paint coat which lacquer coat does not cure at enamel curing conditions;
    applying a second partially cured lacquer coat to the first lacquer coat;
    applying a photo resist material to the second partially cured lacquer coat, which photo resist material normally will not adhere to an uncured enamel paint;
    exposing the photo resist material to a source of ultraviolet light through an appropriate mask to form the image on the photo resist material;
    developing the image in the photo resist material;
    removing the lacquer coats and uncured enamel paint coat to uncover the baked enamel substrate in the form of the image while the rest of the substrate remains protected;

removing the remaining photo resist material from the second lacquer coat;

curing the uncured enamel coat in the form of the image by baking at a sufficient temperature for a time to cure such coat; and removing the remaining lacquer coats from the cured enamel whereby the substrate remains displaying the desired cured enamel image.

3. The method of claim 2 wherein the mask has a positive image and a negative photo resist is used to form the photo resist coat.

* * * * *